(12) United States Patent
Fasen

(10) Patent No.: US 7,057,301 B1
(45) Date of Patent: Jun. 6, 2006

(54) SEMICONDUCTOR WAFER

(75) Inventor: Donald J. Fasen, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/927,549

(22) Filed: Aug. 26, 2004

(51) Int. Cl.
*H01L 23/29* (2006.01)

(52) U.S. Cl. ................................ 257/798; 438/464
(58) Field of Classification Search .............. None
See application file for complete search history.

(56) References Cited

U.S. PATENT DOCUMENTS

2005/0018379 A1\* 1/2005 Ito ........................... 361/302

\* cited by examiner

*Primary Examiner*—Dung A. Le

(57) ABSTRACT

A semiconductor wafer is disclosed. The semiconductor wafer includes a wafer body. The wafer body includes an electrostatic force generating arrangement for assisting in an alignment of the wafer body with respect to another wafer body.

4 Claims, 2 Drawing Sheets

SEMICONDUCTOR WAFER

FIELD

This invention relates generally to semiconductor wafers and, more particularly, to a semiconductor wafer and to a method of aligning semiconductor wafers.

BACKGROUND

In the fabrication of semiconductor devices having multiple wafers arranged in a stacked relationship, it is necessary to achieve accurate wafer to wafer alignment. This alignment must be along both X and Y axes and about a rotational axis of the wafers. The alignment is relative to features on the wafer surfaces generated by lithographic techniques.

Currently, optical targets are cut into semiconductor wafers to perform alignment. While this method is automated, it can only achieve a wafer to wafer accuracy of approximately 5 µm. Achievement of this level of accuracy requires either a longer stroke of the mover or wasted space on the media of the wafer to allow for the misalignment.

Yet another method of achieving wafer to wafer alignment makes use of vias etched into the media in which mechanical locating devices, such as locating pins, are received. It is extremely difficult to etch vertical surfaces accurately into the media. It is also time consuming and generates additional steps which results in added expense.

A need therefore exists to provide a wafer that can be easily and accurately aligned.

SUMMARY

A semiconductor wafer is disclosed. The semiconductor wafer includes a wafer body. The wafer body includes an electrostatic force generating arrangement for assisting in an alignment of the wafer body with respect to another wafer body.

DETAILED DESCRIPTION OF EXEMPLARY EMBODIMENT

Figure 1:
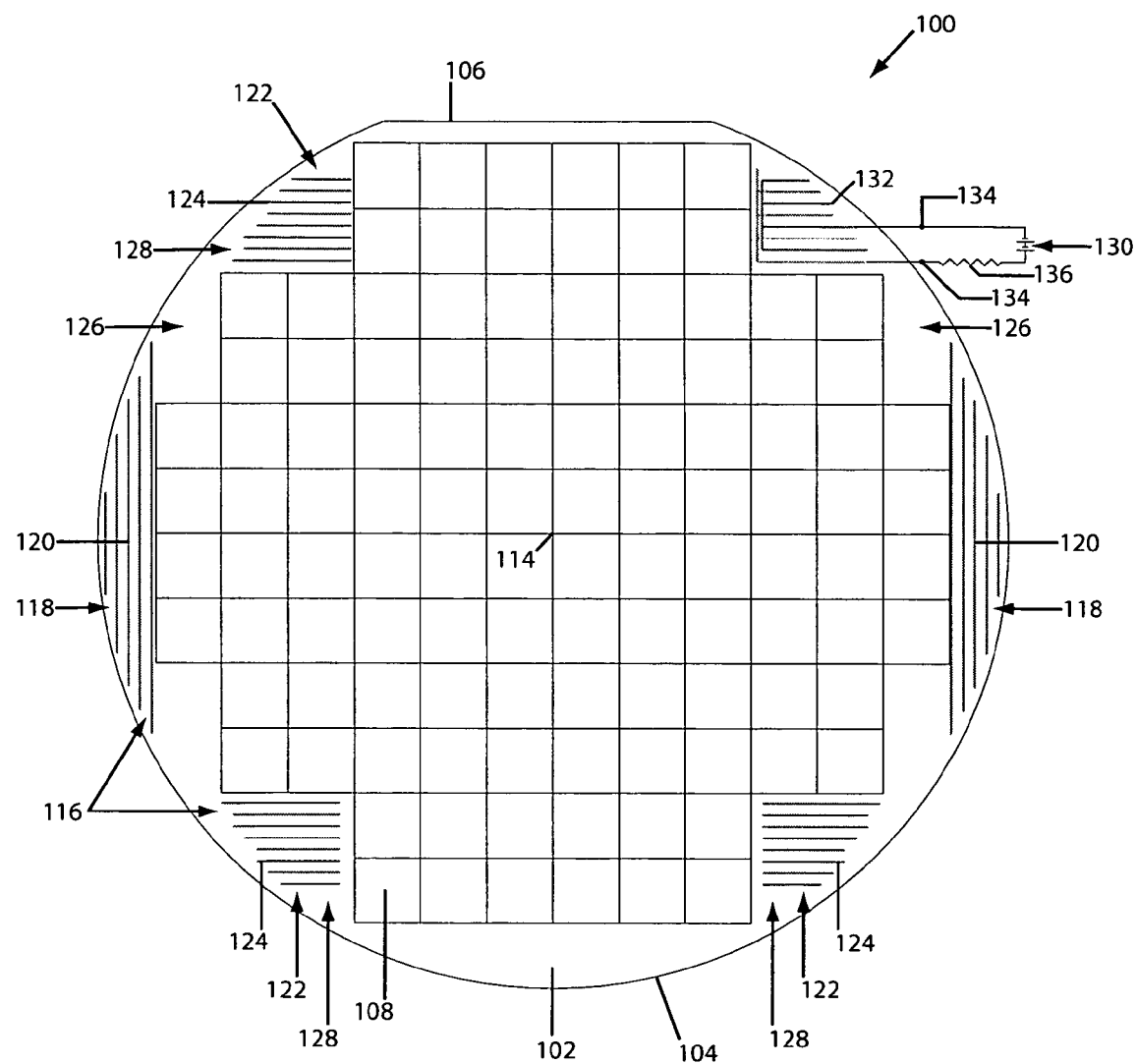
FIG. 1 shows a plan view of a semiconductor wafer, in accordance with an embodiment of the invention.
Figure 1:
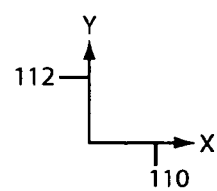

In FIG. 1 of the drawings, reference numeral 100 generally designates a semiconductor wafer in accordance with an embodiment of the invention. The wafer 100 includes a wafer body 102 having a generally circular periphery 104 apart from a flattened edge 106 which acts as a datum edge.

The wafer body 102 is subdivided into a plurality of wafer segments 108 into which the wafer body 102 is diced to provide semiconductor devices constituted by the segments 108.

In the manufacture of the semiconductor devices, a plurality of wafer bodies 100 are aligned to provide multilayered semiconductor devices. Hence, the wafer bodies 102 are aligned along an X axis 110, along a Y axis 112 and about a common rotational axis passing through a center 114 of the stacked wafer bodies 102.

To facilitate the alignment of the wafer bodies 102, each wafer body 102 carries an electrostatic force generating arrangement 116. An electrostatic force generating arrangement 116 may be carried on each surface of the wafer body 102.

The electrostatic force generating arrangement 116 on each surface of the wafer body 102 includes first electrode arrays 118, each constituted by a plurality of spaced, elongate X electrodes 120 for aligning the wafer bodies 102 along the X axis 110. The electrostatic force generating arrangement 116 further includes second electrode arrays 122, each constituted by a plurality of spaced, elongate Y electrodes 124 for aligning the wafer bodies 102 along the Y axis 112. The electrodes 124 of the electrode arrays 122 thus extend orthogonally with respect to the electrodes 120 of the electrode arrays 118.

Conveniently, the electrodes 120 of the electrode array 118 are arranged in unused spaces 126 between outer segments 108 of the wafer body 102 and the periphery 104 of the wafer body 102. Similarly, the electrodes 124 of the electrode arrays 122 are arranged in unused spaces 128 between outer segments 108 on the wafer body 102 and the periphery 104 of the wafer body 102.

The electrode arrays 118, 122 are connectable to an external power source 130 via a connector in the form of a connector pad 132. The connector pad 132 overlies a part of one of the electrode arrays 122. The connector pad 132 connects to the power source 130 via probe fingers 134. In the case where the wafer body 102 is stationary, the probe fingers 134 are rigid. Instead, where the wafer body 102 is movable relative to another wafer body 102, the probe fingers 134 are of a compliant material.

Once facing surfaces of the wafer bodies 102 of two wafers 100 being aligned come into contact with each other, the electrodes 120, 124 on one wafer body 102 may short electrically with the electrodes 120, 124 on the facing surface of the other wafer body 102. To limit the current flowing as a result of the short circuit and, since the power source 130 is a DC power source, a current limiting element, in the form of a current limiting resistor 136, is arranged in series between the power source 130 and the connector pad 132.

In use, to bring the elements 108 of two semiconductor wafers 100 into alignment, the electrode arrays 118 and 122 on the facing surfaces of the two wafer bodies 102 are energised by connection to their respective power sources 130 via the finger probes 134.

Figure 2:
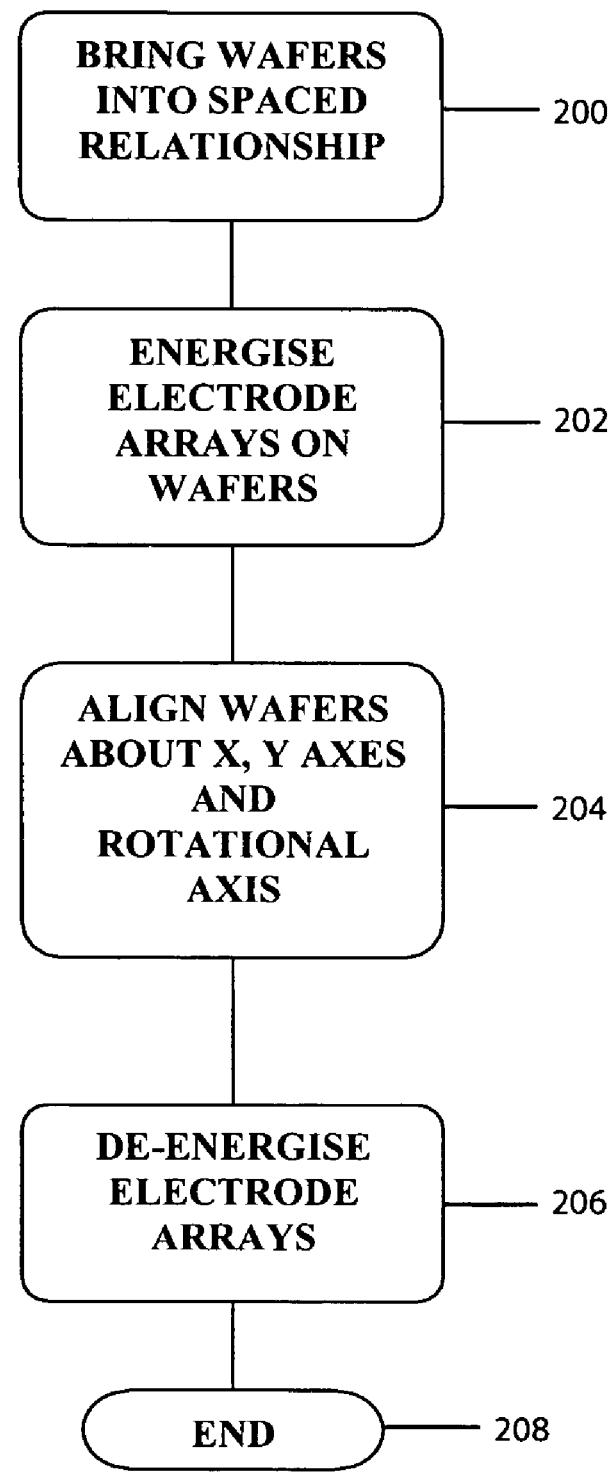
FIG. 2 shows a flow chart of a method of aligning semiconductor wafers, in accordance with an embodiment of the invention.

FIG. 2 shows a flow chart of a method of aligning semiconductor wafers. At step 200, the wafer bodies 102 of two wafers 100 are brought into spaced, stacked alignment approximately about a rotational axis passing through the centers 114 of the two wafer bodies 102. At step 202, the electrode arrays 118, 122 on facing surfaces of the wafer bodies 102 are energised. When the electrode arrays 118, 122 are energised, electrostatic forces are generated to cause alignment of the wafer bodies 102 along the X axis 110, along the Y axis 112 and the rotational axis passing through the centers 114 as shown at step 204.

In an embodiment, the power source 130 generates a voltage of 300 volts. The electrodes 120 and 124 of the electrode arrays 118 and 122, respectively, have a pitch of about 50 µm and cover an electrode area of about 100 mm$^2$. At a gap between the wafer bodies 102 of about 50 µm, an electrostatic force tending to align the wafer bodies 102 of approximately 0.003 Newtons is generated. As the gap decreases, the electrostatic force increases so that, when the gap between the wafer bodies 102 is about 5 µm, an electrostatic force tending to align the wafer bodies 102 of approximately 0.04 Newtons is generated. It will be appreciated that there are many possibilities for the electrode voltage depending on the forces required and dielectric break-down between the electrodes 120, 124.

Once the wafer bodies 102 have been brought into contact with each other, the electrode arrays 118 and 122 are de-energised by disconnection from their respective power sources 130 as shown at step 206. The alignment procedure is completed and is terminated at step 208.

Stiction and friction tending to separate the wafer bodies 102 along with the forces generated by the electrode arrays 118 and 122 determines the amount of residual alignment error existing after the wafer bodies 102 are brought together. Assuming these stiction/friction forces are low relative to the electrostatic forces generated by the electrode arrays 118, 122, alignment errors of less than approximately 1 μm are achievable. This compares with alignment errors of approximately 5 μm achieved using optical techniques.

Accordingly, it is an advantage of the invention that a self-aligning semiconductor wafer 100 is provided which can be aligned with far greater accuracy than using optical alignment techniques. Additionally, the need to form optical targets in the wafer 100 is obviated.

Advantageously, the electrode arrays 118 and 122 can be formed on the wafer body 102 during fabrication of the wafer 100. Thus, the electrode arrays 118 and 122 can be formed during a routine fabrication step in which a conductive layer is deposited and etched on the surface of the wafer body 12. No separate steps dedicated to fabrication of optical or mechanical alignment devices therefore need to be carried out in the fabrication of the wafer 100.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A semiconductor wafer which comprises a wafer body wherein the wafer body comprises an electrostatic force generating arrangement, which comprises an electrode array, for assisting in an alignment of the wafer body with respect to another wafer body.

2. The wafer of claim 1 in which the electrode array comprises a first set of spaced, elongate electrodes and a second set of spaced, elongate electrodes, the electrodes of the second set extending orthogonally with respect to the electrodes of the first set.

3. The wafer of claim 1 further comprising a connector for connecting the electrostatic force generating arrangement to a power source.

4. The wafer of claim 3 in which the connector comprises a current limiting element.

* * * * *